United States Patent [19]

Kniepkamp et al.

[11] 3,963,537

[45] June 15, 1976

[54] PROCESS FOR THE PRODUCTION OF A SEMICONDUCTOR LUMINESCENCE DIODE

[75] Inventors: Hermann Kniepkamp, Munich; Guenter Winstel, Ottobrunn, both of Germany

[73] Assignee: Siemens Aktiengesellschaft, Berlin & Munich, Germany

[22] Filed: Aug. 27, 1974

[21] Appl. No.: 500,844

[30] Foreign Application Priority Data

Oct. 2, 1973 Germany............................ 2349544

[52] U.S. Cl.................................. 148/175; 29/572; 148/171; 148/172; 156/17; 313/483; 357/17; 357/55; 357/61; 357/88

[51] Int. Cl.²............... H01L 21/306; H01L 29/06; H01L 33/00

[58] Field of Search................... 148/175, 171–172; 357/17, 55, 88, 61; 313/108 D; 156/17; 29/572

[56] References Cited
UNITED STATES PATENTS

| | | | |
|---|---|---|---|
| 3,099,591 | 7/1963 | Shockley...................... | 148/175 X |
| 3,119,947 | 1/1964 | Goetzberger.................. | 357/17 X |
| 3,343,026 | 9/1967 | Luechinger.................... | 313/108 D |
| 3,675,064 | 7/1972 | Coleman et al................ | 313/108 D |

OTHER PUBLICATIONS

IEEE Journal of Quantum Electronics, vol. QE–8, No. 3, Mar. 1972, pp. 370 & 371.
Rupprecht et al., "Electroluminescent Display Devices," I.B.M. Tech. Discl. Bull., vol. 10, No. 10, Mar. 1968, p. 1479.
Chiu et al., "Vidicon Diode Array," IBID., vol. 15, No. 6, Nov. 1972, p. 1976.
Blum et al., "Solid-State Light-Emitting Diodes," IBID., vol. 13, No. 9, Feb. 1971, p. 2494.

Primary Examiner—L. Dewayne Rutledge
Assistant Examiner—W. G. Saba
Attorney, Agent, or Firm—Hill, Gross, Simpson, Van Santen, Steadman, Chiara & Simpson

[57] ABSTRACT

A process for producing semiconductor luminescence diodes wherein an epitaxial layer is deposited on a monocrystal composed of a semi-insulating semiconductor material, a portion of the monocrystal at least up to the level of the epitaxial layer is removed to leave a border of monocrystal material and exposed epitaxial layer, and a dopant is diffused into this exposed epitaxial layer and the remaining border of the monocrystal material to produce a pn-junction in the epitaxial layer, and finally suitable electrodes are applied to the thus redoped zone of the epitaxial layer.

7 Claims, 1 Drawing Figure

U.S. Patent June 15, 1976 3,963,537
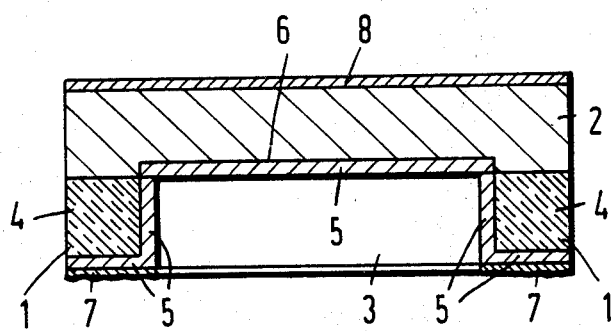

PROCESS FOR THE PRODUCTION OF A SEMICONDUCTOR LUMINESCENCE DIODE

BACKGROUND OF THE INVENTION

1. Field of the Invention

This invention is in the field of producing semiconductor luminescence diodes and involves controlled removal of a monocrystal on which has been grown an epitaxial layer and the formation of a pn-junction in the exposed areas.

2. Description of the Prior Art

There are processes for producing semiconductor luminescence diodes which employ a disc-shaped monocrystal as a substrate, the monocrystal usually consisting of a semi-insulating material such as gallium arsenide (GaAs). One surface of the monocrystal has deposited on it a doped mixer crystal layer usually of gallium-aluminum arsenide whose aluminum content reduces with increasing distance from the substrate. This mixed crystal layer forms the actual semiconductor body of the luminescence diode. It must therefore be provided with a pn-junction and the electrodes therefor. A known process of this type is described in the "IEEE Journal of Quantum Electronics", Volume QE-8, No. 3, March 1972, pages 370 and 371.

A typical process for producing such luminescence diodes starts with a solution of gallium arsenide in molten gallium, mixed with a conventional dopant such as tellurium and also containing aluminum. This molten material is brought into contact with a semi-insulating substrate of gallium arsenide at an appropriately high temperature such as 950°C. As a result of a reduction in temperature, crystallization takes place, the crystallized material having a lower aluminum content at increasing distances from the surface. The aluminum gallium arsenide ratio in the melt is usually on the order of 1 to 30 to 1 to 40, in which case the desired epitaxial layer is obtained without difficulty if the substrate is brought into contact with the melt at a temperature of approximately 950°C. When a stationary heat equilibrium has been achieved between the substrate and the melt, the temperature of the seed crystal and the melt is slowly reduced to approximately 900°C. A typical melt may be composed of 3 grams of gallium, 10 milligrams of aluminum and 300 milligrams of gallium arsenide at 960°C.

The epitaxial layer obtained in this manner is monocrystalline. It is also n-conducting. A pn-junction is produced by diffusing in zinc or other acceptor element and utilizing a high doping concentration.

SUMMARY OF THE INVENTION

The present invention relates to a process for the production of a semiconductor luminescence diode in which an epitaxial layer is deposited on a monocrystal composed of semi-insulating semiconductor material. The width of the forbidden band decreases with increasing distance from a semi-insulating monocrystal in at least one part of the epitaxial layer, and a pn-junction is produced in the epitaxial layer in such a manner that at least part of the surface of the pn-junction runs parallel to the boundary area between the semi-insulating monocrystal and the epitaxial layer. Finally, a block-free electrode is positioned on each side of the pn-junction. The partial removal of the semi-insulating substrate allows the radiation a free path in the direction toward the substrate. It has in fact proved more favorable in the interest of improving the right yield for the radiated light to leave the epitaxial layer in the direction of an increasing band spacing.

In summary, the monocrystal according to the present invention is etched away or otherwise removed to leave a ring-shaped or frame-shaped border extending up to at least the epitaxial layer. The newly formed surface of the epitaxial layer, and the surface of the remainder of the monocrystal are then exposed to the effects of a dopant which is diffused into the semiconductor material and produces the desired pn-junction in the epitaxial layer. Finally, the zone of the epitaxial layer which has thus been redoped is provided with an electrode applied to the redoped surface of the residue of the monocrystal of semi-insulating semiconductor material.

BRIEF DESCRIPTION OF THE DRAWING

Other objects, features and advantages of the invention will be readily apparent from the following description of a preferred embodiment thereof, taken in conjunction with the accompanying drawing, although variations and modifications may be effected without departing from the spirit and scope of the novel concepts of the disclosure and in which:

The single drawing illustrates, on a very highly enlarged scale, a luminescence diode produced according to the present invention.

DESCRIPTION OF THE PREFERRED EMBODIMENTS

In the preferred embodiment of the present invention, we provide a monocrystal 1 originally in the shape of a disc and consisting of a semi-insulating material such as gallium arsenide which is provided in the usual way with an epitaxial layer 2 of n-conducting gallium aluminum-arsenide. A process suitable for producing such an epitaxial layer has been described previously. Another possibility consists in depositing the epitaxial layer from the gas phase and altering the composition gas mixture from which the semiconductor material is deposited in such a way that an epitaxial layer is deposited which has a varying aluminum content and a gallium content which change inversely with respect to each other.

The thickness of the epitaxial layer 2 is within the range of about 100 to 150 microns and its doping level is set at a value of about $2 \times 10^{18}$ per cubic centimeter. Tellurium is a typical dopant so that the layer becomes n-conducting.

After the production of the epitaxial layer 2, we then provide at least one window 3 which penetrates through to the material of the epitaxial layer 2. This is accomplished by etching the substrate of the semi-insulating gallium arsenide 1. The window 3 can actually be extended into the epitaxial layer 2 itself. The window 3 is thus surrounded by the remaining ring-shaped or frame-shaped residue 4 of the original substrate 1, depending upon its original crosssection.

If a plurality of diodes are simultaneously produced in the semiconductor body consisting of the substrate 1 and the epitaxial layer 2, there will be a plurality of windows 3 arranged next to each other. The frame-shaped residue 4 is then of a lattice or honeycomb formation. The plurality of diodes can then be cut into individual diodes which are of the type shown in the FIGURE.

The windows 3 can be produced by techniques common to this art. The epitaxial layer 2, for example, may be completely covered with photo lacquer and the semi-insulating substrate 1 covered with photo lacquer at the points where the frame structure 4 is to appear. The semi-insulating substrate 1 can be removed at the unprotected points, for example, with a mixture of sulfuric acid, hydrogen peroxide and water in a concentration of 3 parts acid to 1 part of peroxide and 1 part of water.

After etching, the semiconductor is exposed to zinc vapor at an increased temperature so that a p+ conducting zone 5 is formed both in the epitaxial layer 2 at the base of the window 3, and also on the adjoining surfaces of the ring-shaped or frame-shaped border 4 of semi-insulating gallium arsenide, which zone forms a pn-junction with the part of the epitaxial layer 2 which has not been redoped. The surface concentration of zinc is about $1 \times 10^{19}$ per cubic centimeter and the penetration depth is about 2 microns. The p-conducting zone 5 is then provided with a block-free electrode 7 which is applied to the surface of the border 4 of semi-insulating semiconductor, and also contacts the zone 5 at this point. The opposite rear side of the epitaxial layer 2 is also provided with a block-free layer electrode 8.

The process of the present invention thus provides a convenient and reproducible means for producing semiconductor luminescence diodes without the disadvantages of the prior art.

It should be evident that various modifications can be made to the described embodiments without departing from the scope of the present invention.

We claim as our invention:

1. In the process of producing a semiconductor luminescence diode in which an epitaxial layer is deposited on a monocrystal composed of a semi-insulating semiconductor material and a pn-junction is formed in the epitaxial layer in such a manner that at least a part of the surface of the pn-junction runs parallel to the boundary area between said monocrystal and said epitaxial layer, the combination of said epitaxial layer and said monocrystal providing a light emitting diode, the improvement which comprises removing a portion of said monocrystal at least up to the level of the epitaxial layer to leave a border of monocrystal material, diffusing a dopant into the thus exposed epitaxial layer and the remaining border of monocrystal material to produce said pn-junction in said epitaxial layer, and finally applying a block-free electrode to each side of the resulting pn-junction.

2. The process of claim 1 wherein the monocrystal is composed of gallium arsenide having a doped layer of GaAl-As in which the ratio of Al to Ga varies as a function of the distance from the surface of said monocrystal, and in which the pn-junction is produced by the diffusion of acceptor material.

3. The process of claim 2 in which the epitaxial layer is deposited in such a manner that the aluminum content decreases with increasing distance from the surface of the monocrystal.

4. The process of claim 1 in which the epitaxial layer is first doped with an n-type dopant and the pn-junction is formed by diffusing zinc at the surface of the epitaxial layer formed by the partial removal of the monocrystal and the remaining border of monocrystal.

5. The process of claim 4 in which the zone doping is carried out to a surface concentration of about $1 \times 10^{19}$ per cubic centimeter and a penetration depth of about 2 microns.

6. The process of claim 4 in which the n-type dopant is present at a concentration of about $2 \times 10^{18}$ per cubic centimeter.

7. The process of claim 1 in which the thickness of the epitaxial layer is in the range from about 100 to 150 microns.

* * * * *